US011083099B2

(12) United States Patent
Madsen et al.

(10) Patent No.: US 11,083,099 B2
(45) Date of Patent: Aug. 3, 2021

(54) PRINTED CIRCUIT BOARD ELECTRICAL CONNECTOR LOCKING VIA THREADED FASTENERS

(71) Applicant: SMART Embedded Computing, Inc., Tempe, AZ (US)

(72) Inventors: Christopher M. Madsen, Mesa, AZ (US); David Paul Banasek, Mesa, AZ (US)

(73) Assignee: SMART Embedded Computing, Inc., Tempe, AZ (US)

( * ) Notice: Subject to any disclaimer, the term of this patent is extended or adjusted under 35 U.S.C. 154(b) by 0 days.

(21) Appl. No.: 16/668,019

(22) Filed: Oct. 30, 2019

(65) Prior Publication Data

US 2021/0136939 A1  May 6, 2021

(51) Int. Cl.
*H05K 5/00* (2006.01)
*H05K 5/02* (2006.01)
*H01R 12/70* (2011.01)

(52) U.S. Cl.
CPC ....... *H05K 5/0221* (2013.01); *H01R 12/7011* (2013.01); *H05K 5/006* (2013.01)

(58) Field of Classification Search
USPC ....................................................... 361/759
See application file for complete search history.

(56) References Cited

U.S. PATENT DOCUMENTS

| | | | | | |
|---|---|---|---|---|---|
| 4,417,778 | A | * | 11/1983 | Halvorsen | H05K 7/1461 439/328 |
| 4,906,197 | A | * | 3/1990 | Noll | G02B 6/3817 385/56 |
| 5,234,348 | A | * | 8/1993 | Konsevich | H05K 7/1439 361/752 |
| 5,317,480 | A | * | 5/1994 | Chandraiah | H01R 13/631 361/760 |
| 7,234,960 | B2 | * | 6/2007 | Carullo | H01R 13/629 439/378 |
| 7,458,815 | B2 | * | 12/2008 | Fallah-Adl | H05K 7/1451 361/695 |
| 2018/0115097 | A1 | * | 4/2018 | Downing | H01R 13/6215 |

* cited by examiner

*Primary Examiner* — Hung S. Bui
(74) *Attorney, Agent, or Firm* — Harness, Dickey & Pierce, P.L.C.

(57) ABSTRACT

A circuit board includes a first locking mechanism configured to secure the circuit board to a chassis. The circuit board also includes a connector disposed at an inboard end of the circuit board. The connector is configured to be electrically connected to a mating connector on either a backplane or a circuit board. The circuit board also includes a second locking mechanism. The second locking mechanism is configured to secure the connector of the circuit board to the mating connector of the backplane or the circuit card.

20 Claims, 12 Drawing Sheets

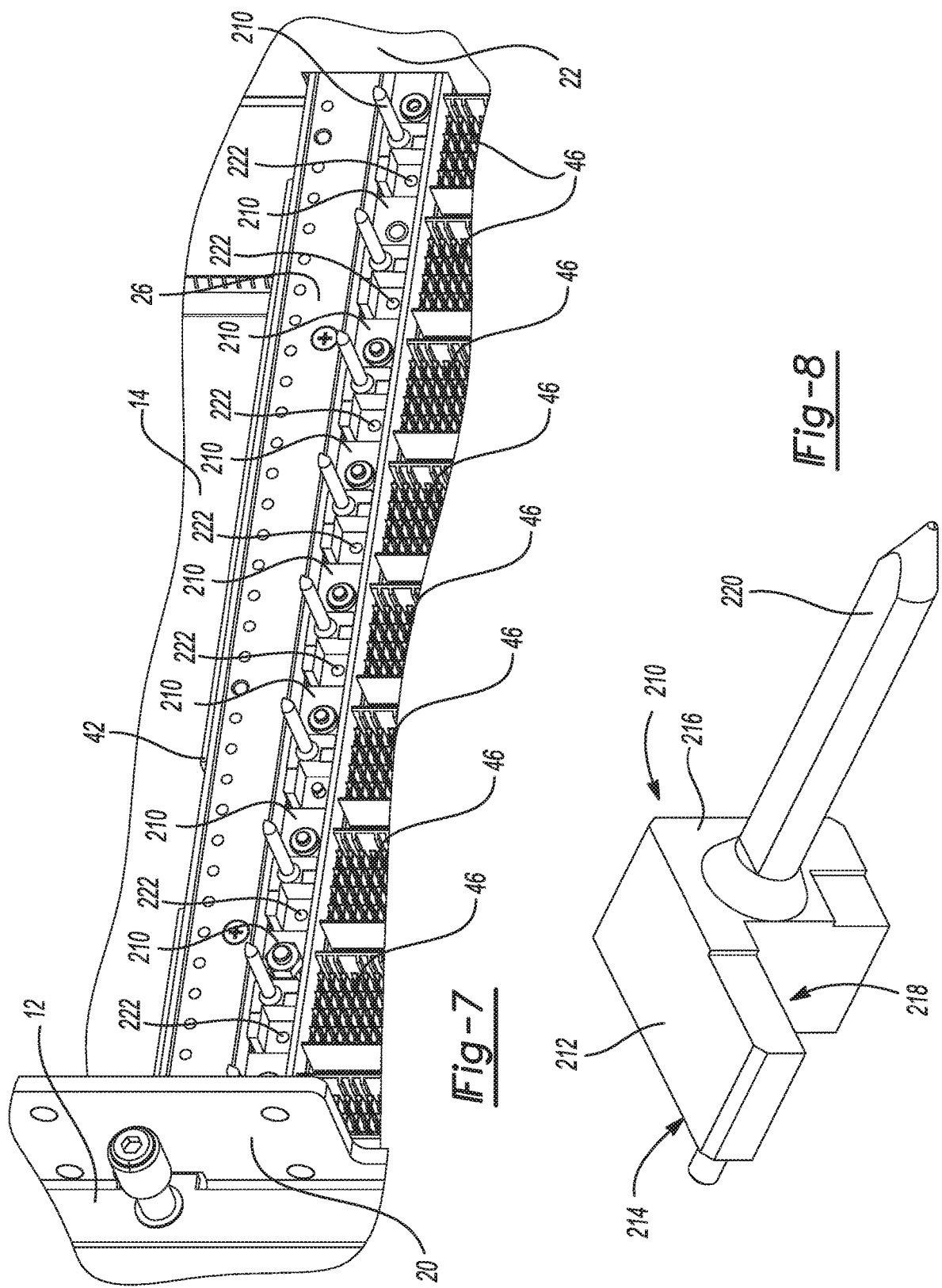

US 11,083,099 B2

PRINTED CIRCUIT BOARD ELECTRICAL CONNECTOR LOCKING VIA THREADED FASTENERS

FIELD

The present disclosure relates to locking mechanisms used in conjunction with printed circuit boards (PCBs), and more particularly a locking mechanism including one or more threaded fasteners disposed near an electrical connector of the PCB.

BACKGROUND

This section provides background information related to the present disclosure which is not necessarily prior art.

Ruggedized electronic systems commonly include one or more printed circuit boards (PCBs). PCBs are typically slidably received in an electronics chassis via opposing chassis guide rails, which sequentially locate multiple PCBs. Each PCB has at least one connector located at a back or inboard side of the PCB. The PCB connectors are physically and electrically connected to respective mating connectors, such as on a backplane or a midplane within the chassis. Each PCB is fixed to the chassis by a locking mechanism, such as one or more clips disposed on front handles of the PCB, or one or more wedge locks disposed on sides of the PCB.

SUMMARY

This section provides a general summary of the disclosure, and is not a comprehensive disclosure of its full scope or all of its features.

A circuit board includes a first locking mechanism configured to secure the circuit board to a chassis. The circuit board also includes a connector disposed at an inboard end of the circuit board. The connector is configured to be electrically connected to a mating connector on either a backplane or a circuit board. The circuit board also includes a second locking mechanism. The second locking mechanism is configured to secure the connector of the circuit board to the mating connector of the backplane or the circuit card.

A circuit assembly includes a first circuit board. The first circuit board includes a first connector and defines a first threaded receptacle disposed adjacent to the first connector. The circuit card assembly also includes a second circuit board. The second circuit board includes a second connector and defines a first aperture adjacent to the second connector. The second connector engages and is electrically connected to the first connector. The circuit board assembly also includes a first threaded fastener extending through the first aperture of the second circuit board. The first threaded fastener is received in the first threaded receptacle of the first circuit board to maintain engagement between the first connector and the second connector.

An electronics assembly includes a chassis. The chassis includes a first wall, defining a first aperture. The electronics assembly also includes a first circuit board. The first circuit board is disposed within the chassis. The first circuit board includes a first connector and defines a threaded receptacle adjacent to the first connector. An electronics assembly also includes a second circuit board disposed within the chassis. The second circuit board includes a second connector and defines a second aperture. The second connector engages and is electrically connected to the first connector. The electronics assembly also includes a threaded fastener extending through the first aperture and the second aperture. The threaded fastener is received in the threaded receptacle of the first circuit board to maintain engagement between the first connector and the second connector. The first circuit board and the second circuit board are differently selected from either a first circuit card, a second circuit card, or a backplane.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7 is a partial front left perspective view of a front side of the backplane of FIG. 1 including a plurality of fastener blocks;

FIG. 8 is a perspective view of a fastener block of FIG. 7;

Corresponding reference numerals indicate corresponding parts throughout the several views of the drawings.

DETAILED DESCRIPTION

Figure 1:
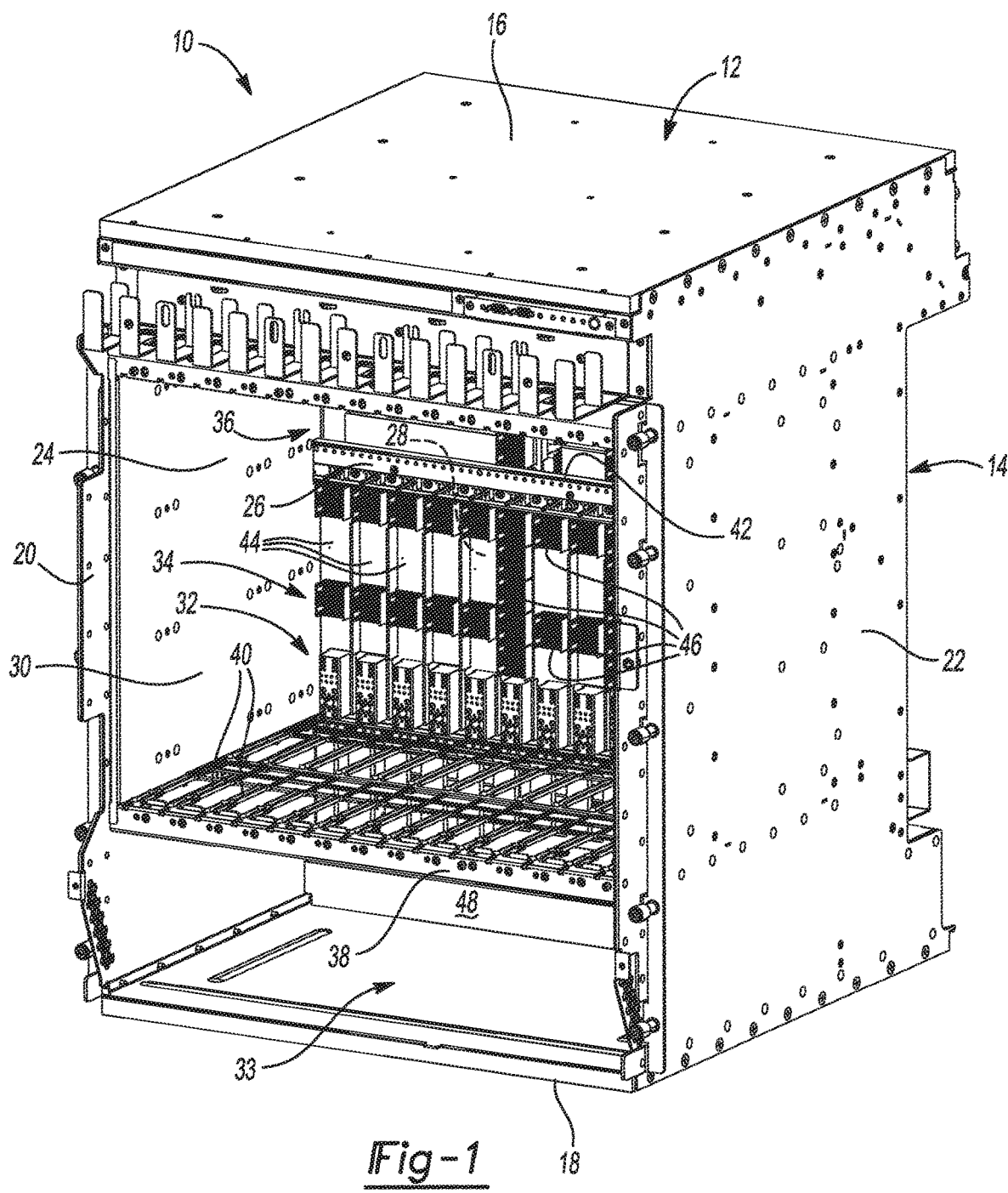
FIG. 1 is a front perspective view of an inside of an electronics assembly including a chassis and a backplane in accordance with the present disclosure.

Example embodiments will now be described more fully with reference to the accompanying drawings.

As discussed above, PCBs are typically fixed to an electronics chassis at a front of the PCB or sides of the PCB. Some PCBs are fixed to the chassis by clips disposed at an outboard or front end of the PCB. For example, an ATCA blade board includes two clips, each clip being disposed on a respective front handle of the ATCA blade board. The front handles are disposed near front corners of the ATCA blade board (e.g., where the front end meets each of two opposing side edges). The clips engage guide rails on the chassis to fix the ATCA blade board to the chassis. Other PCBs are fixed to the chassis by wedge locks. A wedge lock is disposed adjacent to a side edge of the PCB. The wedge lock engages a U-shaped channel in the chassis to fix the PCB to the chassis.

PCBs include electrical connectors that are physically and electrically interfaced with mating connectors on a backplane, a midplane, or another circuit card within the chassis. The electrical connectors can become disconnected, for example during high shock and high vibration loads. Although the PCBs re fixed to the chassis, the high flexibility of a PCBs can nonetheless cause the electrical connector to become disconnected from the mating connector on the backplane, midplane, or other circuit card.

In various aspects, the present disclosure provides a PCB locking mechanism disposed adjacent to an electrical connector. The placement of the locking mechanism may ensure that the electrical connector maintains physical and electrical contact with a mating connector. The locking mechanism may include one or more threaded fasteners received in respective threaded receptacles on the other component. In certain aspects, the locking mechanism may further include a guide pin received in a guide receptacle to facilitate proper alignment of the PCB electrical connector with the mating connector. In other aspects, the locking mechanism may further include a spring disposed around a shaft of the threaded fastener. The spring may function as a lock washer to prevent the fastener from becoming loose during vibration. The spring may also force the threaded fastener out of the threaded receptacle when it becomes loose to provide a visual indication that the connectors may become disengaged.

In certain aspects, the PCBs have form factors according to ATCA specifications. In one example, the PCBs may be circuit cards such as ATCA blade boards, RTM boards, fan controller modules, or power entry modules (PEMs). In another example, the PCBs may be midplanes or backplanes. When the PCBs include ATCA blade boards, RTMs, and a backplane, guide blocks on the ATCA blade boards, RTMs, and backplane may be replaced by fastener blocks to implement a locking mechanism according to the present disclosure. Thus, the locking mechanism of the present disclosure can be implemented in an ATCA system while remaining within ATCA specifications, and without excessive physical modifications to the PCBs or chassis.

Referring to FIG. 1, an electronics assembly 10 according to certain aspects of the present disclosure is provided. The electronics assembly 10 may include an electronics equipment enclosure or chassis 12 (e.g., an ATCA chassis). The chassis 12 may include a front plate (not shown) and a back plate 14 disposed opposite the front plate. The chassis 12 further includes a top plate 16 and a bottom plate 18 disposed opposite the top plate 16. The chassis 12 includes a first or left side wall 20, and a second or right side wall 22 disposed opposite the left side wall 20. The front plate, back plate 14, top plate 16, bottom plate 18, left side wall 20, and right side wall 22 cooperate to define an interior compartment 24. The electronics assembly 10 may further include a backplane 26 extending between the side walls 20, 22.

The backplane 26 may extend from the bottom plate 18 of the chassis 12 toward the top plate 16 of the chassis 12. The left side wall 20, the right side wall 22, the backplane 26, and the back plate 14 may at least partially define a rear card cage portion 28. The left side wall 20, the right side wall 22, the backplane 26, and the front plate may at least partially define a front card cage portion 30. The front card cage portion 30 may include a first zone 32 (Zone 1), a second zone 34 (Zone 2), and a third zone 36 (Zone 3).

The front card cage portion 30 may include an internal support 38 having a plurality of rails 40. The internal support 38 may extend between the left side wall 20 and the right side wall 22, and between the front plate and the backplane 26. The internal support 38 may be disposed substantially parallel to the bottom plate 18 and the top plate 16. The internal support 38, the bottom plate 18, the backplane 26, the front plate, the left side wall 20, and the right side wall 22 may cooperate to define a fan tray area 33. The backplane 26 may extend only partially into the interior compartment 24 toward the top plate 16 so that an open space or the third zone 36 is defined between a distal edge 42 of the backplane 26 and the top plate 16. The second zone 34 is disposed between the first zone 32 and the third zone 36. The interior compartment 24 is at least partially defined by the internal support 38, the backplane 26, the front plate, the left side wall 20, and the right side wall 22. Each of the first, second, and third zones 32, 34, 36 may accommodate various circuit cards.

The rear card cage portion 28 may include a plurality of rear slots (see, e.g., rear slots 248 in FIG. 11) for the installation of a respective plurality of rear cards, such as RTM boards. The second zone 34 of the front card cage portion 30 may include a plurality of front slots 44 for the installation of a respective plurality of front cards, such as ATCA blade boards. Each front slot 44 may include at least one electrical connector 46 extending from a front surface 48 of the backplane 26 toward the front plate of the chassis 12. The electrical connectors 46 allow the front cards to be physically and electrically interfaced to the backplane 26. The third zone 36 may accommodate direct connections between PCBs, such as between an ATCA blade board and an RTM board. In one example, the chassis 12 includes fourteen front slots 44 (e.g., for ATCA blade boards) and two rear slots (e.g., for RTM boards).

Figure 2:
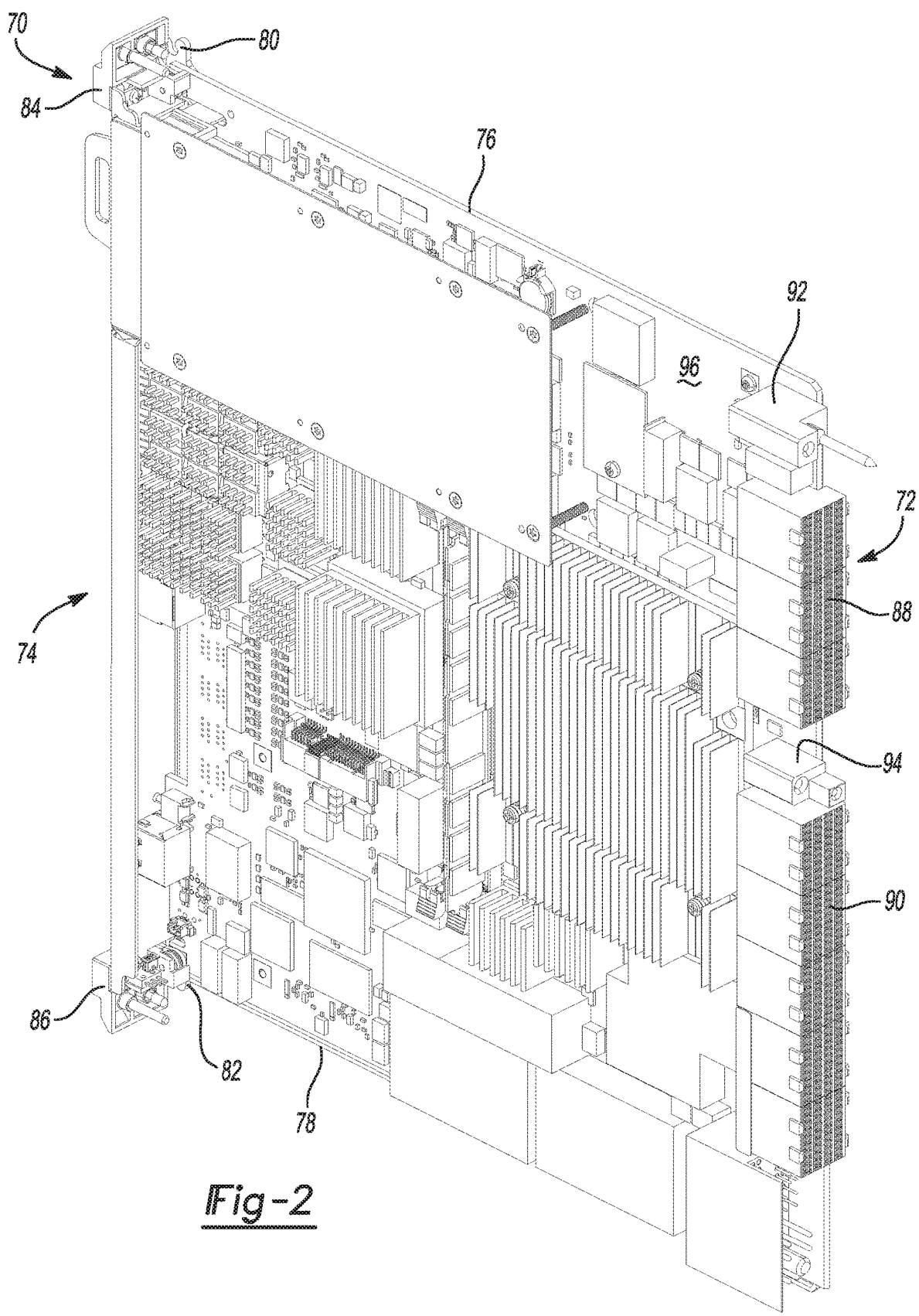
FIG. 2 is a perspective view of an Advanced Telecommunications Computing Architecture (ATCA) blade board in accordance with the present disclosure.
Figure 3:
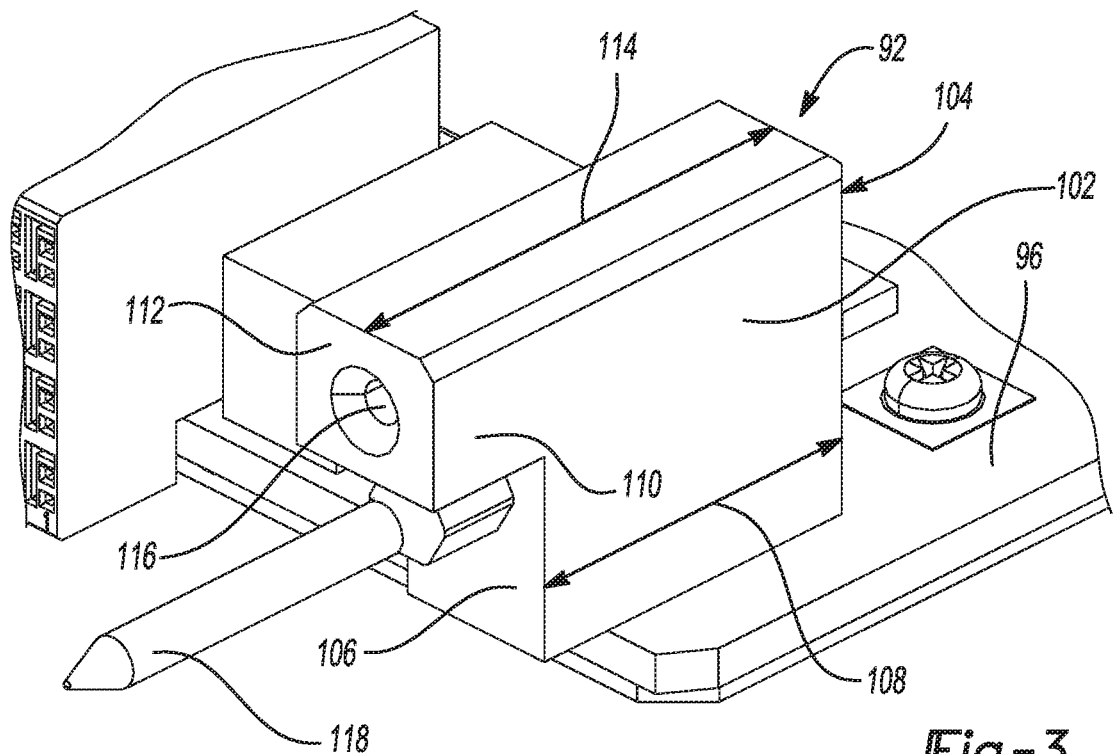
FIG. 3 is a perspective view of a top fastener block of the ATCA blade board of FIG. 2.
Figure 4:
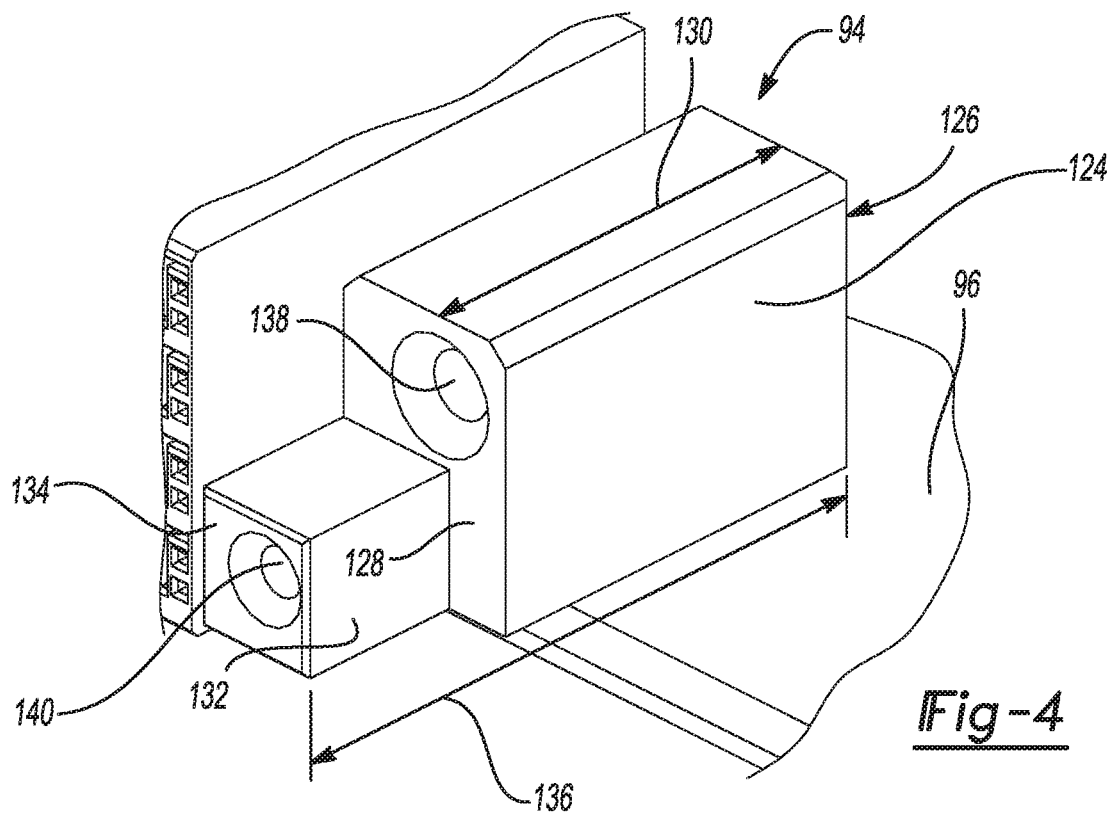
FIG. 4 is a perspective view of a middle fastener block of the ATCA blade board of FIG. 2.

With reference to FIGS. 2-4, an ATCA blade board 70 according to certain aspects of the present disclosure is provided. The ATCA blade board 70 includes a back or inboard end 72 configured to be disposed toward the backplane 26 (i.e., toward the inside of the chassis 12). The ATCA blade board 70 further includes a front or outboard end 74 configured to be disposed away from the backplane 26 and toward the front plate (i.e., toward an outside of the chassis 12). The ATCA blade board includes a top edge 76 extending between the inboard end 72 and the outboard end 74 and a bottom edge 78 opposite the top edge 76 and extending between the inboard end 72 and the outboard end 74.

The outboard end 74 includes first and second locking mechanisms which may be first and second clips 80, 82. The first clip 80 is disposed on a first front handle 84 and the second clip 82 is disposed on a second front handle 86. The first front handle 84 is disposed near a first corner defined by the outboard end 74 and the top edge 76 of the ATCA blade board 70. The second front handle 86 is disposed near a second corner defined by the outboard end 74 and the bottom edge 78 of the ATCA blade board 70. The first and second clips 80, 82 may be used to fix the ATCA blade board 70 to the chassis 12.

The inboard end 72 of the ATCA blade board 70 includes a top electrical connector 88 and a bottom electrical connector 90. The inboard end 72 further includes a top fastener block or locking mechanism 92 and a middle fastener block or locking mechanism 94. The top fastener block 92 may occupy similar space or substantially the same space (i.e., have the same footprint) on an ATCA surface 96 of the ATCA blade board 70 as a top guide block on a conventional ATCA blade board (not shown). The middle fastener block 94 may occupy similar space or substantially the same space on the ATCA surface 96 as a middle guide block on the conventional ATCA board (not shown). Thus, the ATCA blade board 70 of the present disclosure can be assembled by replacing top and middle guide blocks on a conventional ATCA blade board with the respective top and middle fastener blocks 92, 94.

As best shown in FIG. 3, the top fastener block 92 includes a body 102. The body 102 includes a first surface 104 that extends away from the ATCA surface 96 and substantially perpendicular to the ATCA surface 96. The body further includes a second surface 106 opposite the first surface 104 and substantially parallel to the first surface 104. A first distance 108 is defined between the first surface 104 and the second surface 106. The body 102 further includes a projection or step 110 extending from the second surface 106. The step 110 includes a third surface 112 substantially parallel to the first surface 104 and the second surface 106. A second distance 114 defined between the first surface 104 and the second surface 106 may be greater than the first distance 108.

The third surface 112 may define a threaded receptacle 114. The second surface 106 may define a projection, such as a guide pin 118. The guide pin 118 may extend substantially perpendicular from the second surface 106. Respective centers of the threaded receptacle 116 and the guide pin 118 may be aligned along a plane extending substantially perpendicular to the ATCA surface 96.

As best shown in FIG. 4, the middle fastener block 94 includes a body 124. The body 124 includes a first surface 126 that extends away from the ATCA surface 96 substantially perpendicular to the ATCA surface 96. The body 124 further includes a second surface 128 opposite the first surface 126 and substantially parallel to the first surface 126. A first distance 130 is defined between the first surface 126 and the second surface 128. The body 124 further includes a projection or step 132 extending from the second surface 128. The step 132 includes a third surface 134 substantially parallel to the first surface 126 and the second surface 128. A second distance 136 defined between the first surface 126 and the third surface 134 may be greater than the first distance 130.

The third surface 134 may define a threaded receptacle 140. The second surface 128 may define a guide pin receptacle 138. Respective centers of the threaded receptacle 140 and guide pin receptacle 138 may be aligned along a plane extending at an oblique angle with respect to the ATCA surface 96. The geometry of the middle fastener block 94 (i.e., the position of the threaded receptacle 140 and the guide pin receptacle 138 on the fastener block 94) may allow the guide pin receptacle 138 to receive a guide pin of on a conventional guide pin block on a backplane. The ATCA blade board 70 having top and middle connector blocks replaced with respective top and middle fastener blocks 92, 94 may nonetheless comply with ATCA specifications.

Figure 5:
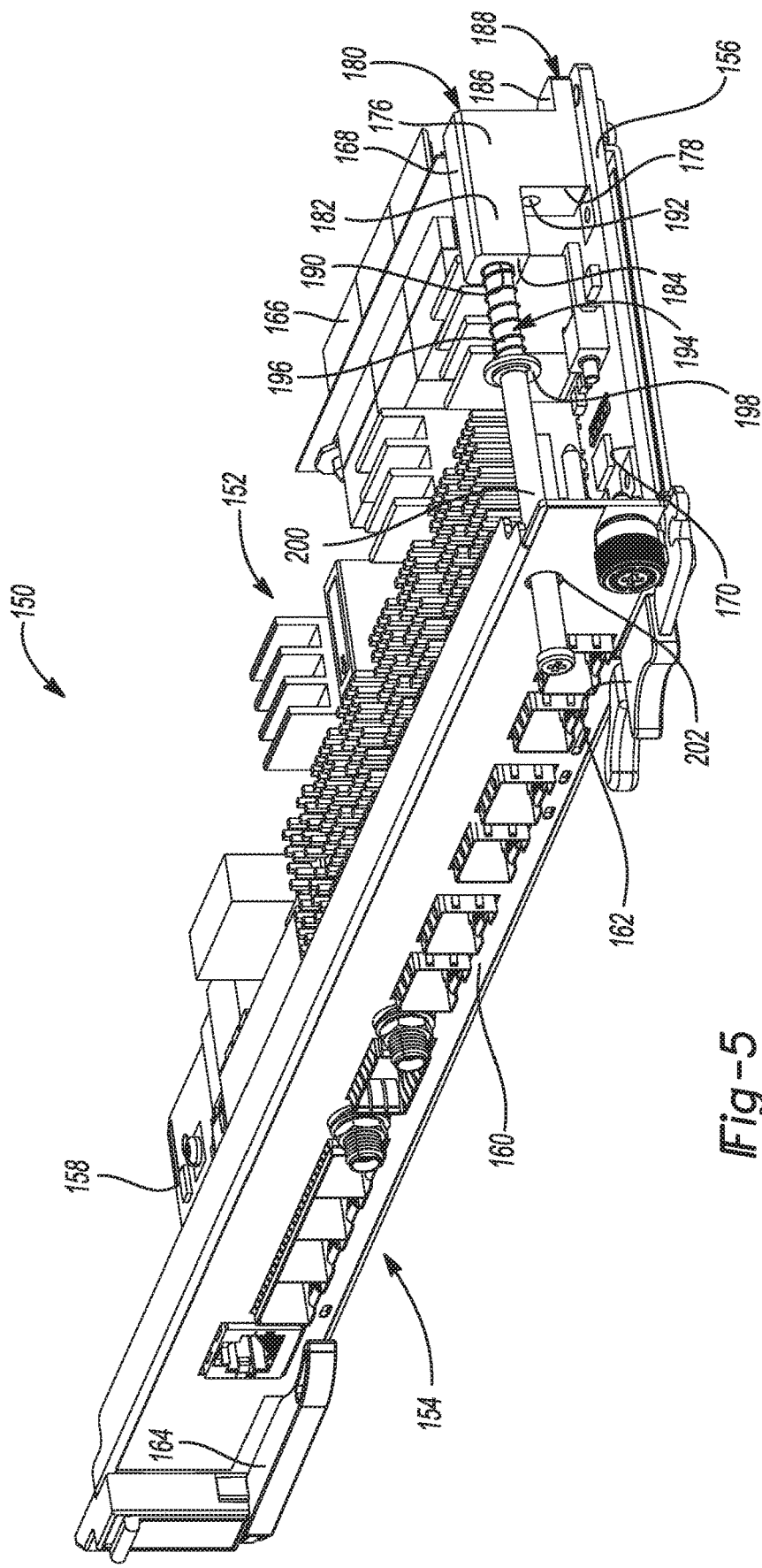
FIG. 5 is a perspective view of a rear transition module (RTM) board in accordance with the present disclosure.

With reference to FIG. 5, an RTM board 150 according to certain aspects of the present disclosure is provided. The RTM board 150 includes an inboard end 152 configured to be disposed toward the backplane 26 and an outboard end 154 configured to be disposed away from the backplane 26 and toward the back plate 14. The RTM board 150 includes a top edge 156 extending between the inboard end 152 and the outboard end 154 and a bottom edge 158 disposed opposite the top edge 156 and extending between the inboard end 152 and the outboard end 154. The RTM board 150 further includes a rear face 160 disposed at the outboard end 154 and configured to be accessible from outside the chassis 12.

The outboard end 154 includes first and second locking mechanisms which may be first and second clips 162, 164 disposed adjacent to the rear race 160. The first clip 162 is disposed near a first corner defined by the outboard end 154 and the top edge 156 of the RTM board 150. The second clip 164 is disposed near a second corner defined by the outboard end 154 and the bottom edge 158 of the RTM board 150. The first and second clips 162, 164 may be used to fix the RTM board 150 to the chassis 12. For example, the RTM board 150 may be fixed to the back plate 14.

The inboard end 152 of the RTM board 150 includes an electrical connector 166. The inboard end 152 further includes a fastener block or locking mechanism 168. The fastener block 168 may occupy similar space or substantially the same space (i.e., have the same footprint) on an RTM surface 170 of the RTM board 150 as a guide block on a conventional RTM board (not shown). Thus, the RTM board 150 of the present disclosure can be assembled by replacing the guide block on a conventional RTM board with the fastener block 168.

The fastener block 168 may include a body 176 having a first surface 178 and a second surface 180 disposed opposite the first surface 178 and substantially parallel to the first surface 178. A first projection or first step 182 may extend from the first surface 178. The first step 182 may include a third surface 184. A second projection or second step 186 may extend from the second surface 180. The second step 186 may include a fourth surface 188. The third surface 184 may define an aperture 190 extending between the third surface 184 and the second surface 180.

The second surface 180 may define a guide pin receptacle 192. The guide pin receptacle 192 may extend between the second surface 180 and the first surface 178. The RTM board 150 may further include a fastener assembly 194, which may be captive in the RTM board 150. The fastener assembly 194 may include a shaft 200 having a washer 198 held in place by a c-clip 199. Washer 198 provides a bias for a spring 196. Spring 196 is seated at one end in aperture 190 and signals shaft 200 away from body 176. Shaft 200 may extend through an aperture 202 in the rear face 160 of the RTM board 150 so that shaft 200 is accessible outside of the chassis 12 when the RTM board 150 is installed in the chassis 12. At an end opposite aperture 202, shaft 200 is threaded (not shown) for engaging corresponding threaded receptacle 116 formed in body 92.

Figure 6:
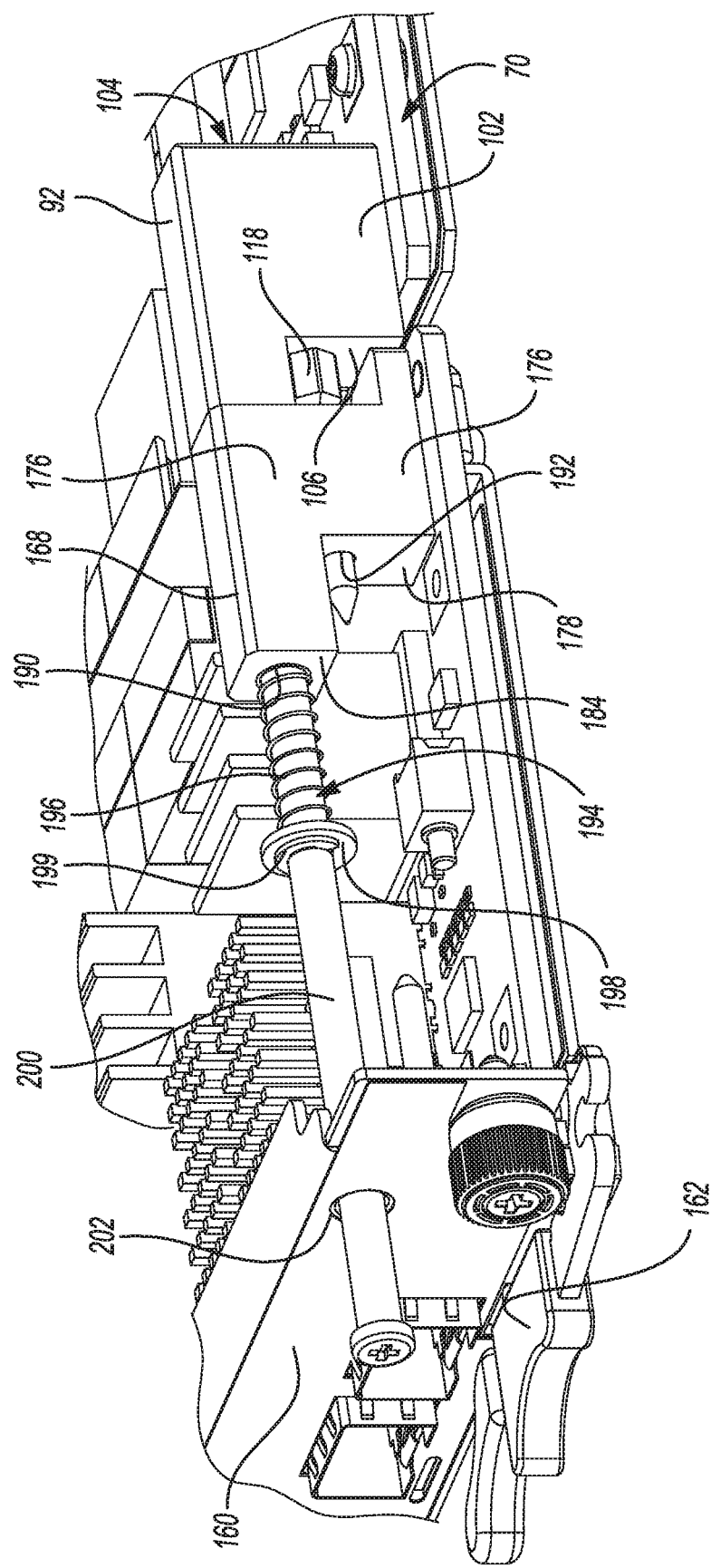
FIG. 6 is a partial perspective view showing a circuit card assembly including the RTM board of FIG. 5 and the ATCA blade board of FIG. 3.

Referring to FIG. 6, the RTM board 150 is assembled to the ATCA blade board 70 within the third zone 36 (FIG. 1). The top electrical connector 88 of the ATCA blade board 70 is physically and electrically connected to the electrical connector 166 of the RTM board 150. The electrical connectors 88, 166 are fixed to one another at the inboard ends 72, 152 of each respective board 70, 150. More specifically the top fastener block or locking mechanism 92 of the ATCA blade board 70 engages the fastener block or locking mechanism 168 of the RTM board 150. The third surface 112 of the top fastener block 92 of the ATCA blade board 70 engages the second surface 180 of the fastener block 168 of the RTM board 150.

The top fastener block 92 and the top electrical connector 88 may be located adjacent to one another on the inboard end 72 of the ATCA blade board 70. Similarly, the fastener block 168 and the electrical connector 166 may be located adjacent to one another on the inboard end 152 of the RTM board 150. In this manner, the electrical connectors 88, 166 are fixed to one another. Fixing the electrical connectors 88, 166 to one another at the inboard ends 72, 152 of the boards 70, 150 ensures that the electrical connectors 88, 166 remain in physical and electrical contact during high shock and high vibration loads. Thus, the locking mechanisms 92, 168 of the present disclosure provide improved contact of the electrical connectors 88, 166 when compared to conventional circuit boards that are fixed to one another indirectly, through the chassis 12 (e.g., by clips 80, 82, 162, 164).

Although the locking mechanisms 92, 168 are shown and described with respect to the ATCA blade board 70 and the RTM board 150, one skilled in the art would appreciate that the locking mechanisms 92, 168 may be used with other circuit boards to fix respective connectors of the circuit boards to one another. It should be appreciated that a location of the threaded receptacle 116 and the aperture 190 may be reversed within the scope of the present disclosure. Similarly, the location of the guide pin 118 and the guide pin receptacle 192 may be reversed within the scope of the present disclosure.

With reference to FIGS. 7-8, the front surface 48 of the backplane 26 is shown. The backplane 26 include a plurality of fastener blocks or locking mechanisms 210. Each front slot 44 is associated with a respective fastener block 210. Each fastener block 210 is disposed adjacent to a respective electrical connector 46 on the backplane 26. The fastener block 210 includes a body 212 including a first surface 214 engaging the backplane 26. The fastener block 210 includes a second surface 216 disposed opposite the first surface 214 and substantially parallel to the first surface 214. The body 212 defines a cutout portion or opening 218 extending between the first surface 214 and the second surface 216. The fastener block 210 further includes a guide pin 220 extending from the second surface 216. The backplane 26 defines a plurality of apertures 222. Each front slot 44 includes an aperture 222. The aperture 222 is aligned with the cutout portion 218 of the fastener block 210 to allow a fastener to pass through the backplane 26 and fastener block 210 (FIG. 7).

The fastener block 210 may occupy similar or less space (i.e., a smaller footprint) on the backplane 26 than the conventional guide pin block. Thus, the backplane 26 of the present disclosure can be assembled by replacing each guide pin block on a conventional backplane with the fastener block 210.

Figure 9:
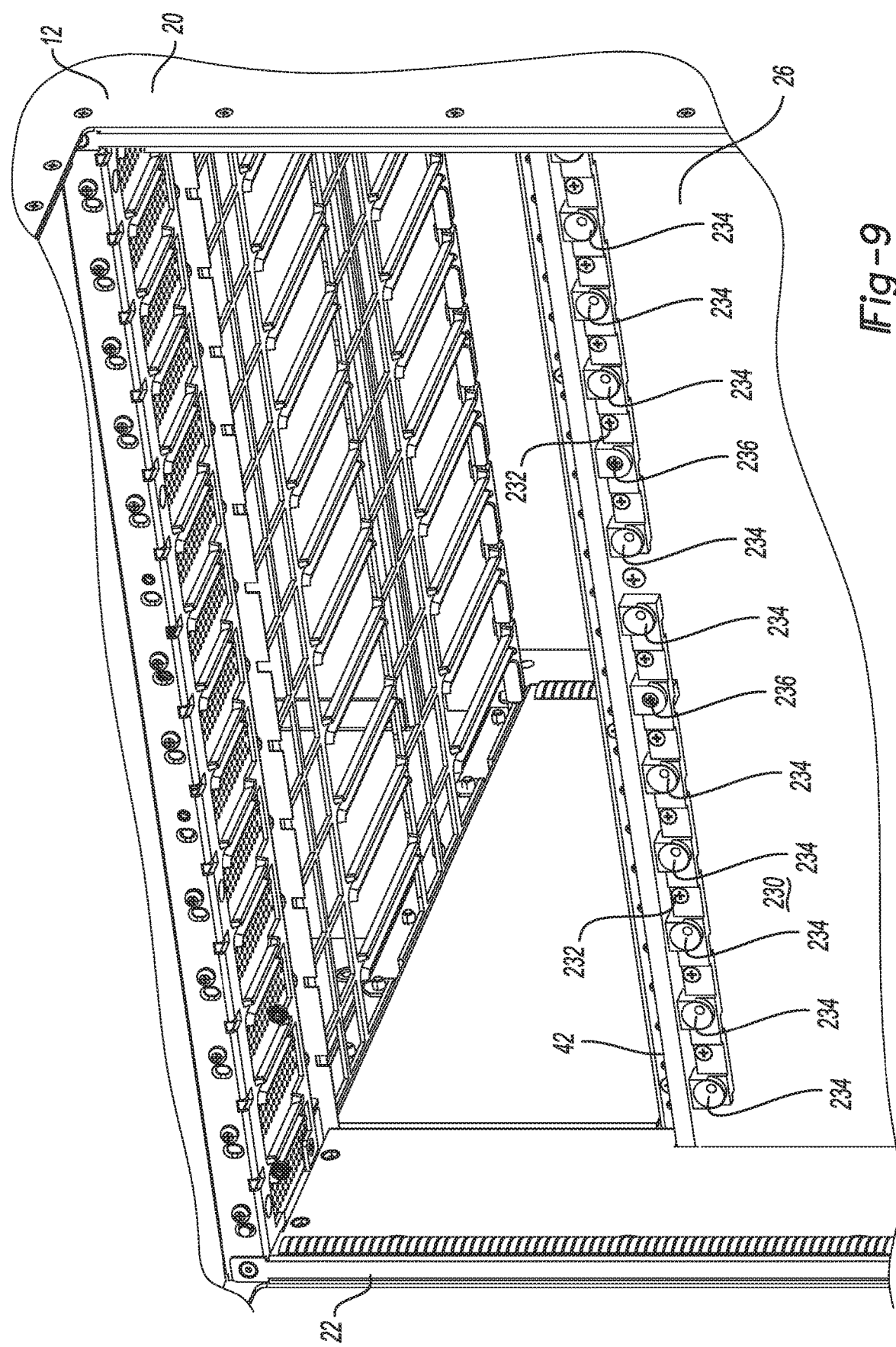
FIG. 9 is a partial back left perspective view of the of a rear side of the backplane of FIG. 1.
Figure 10:
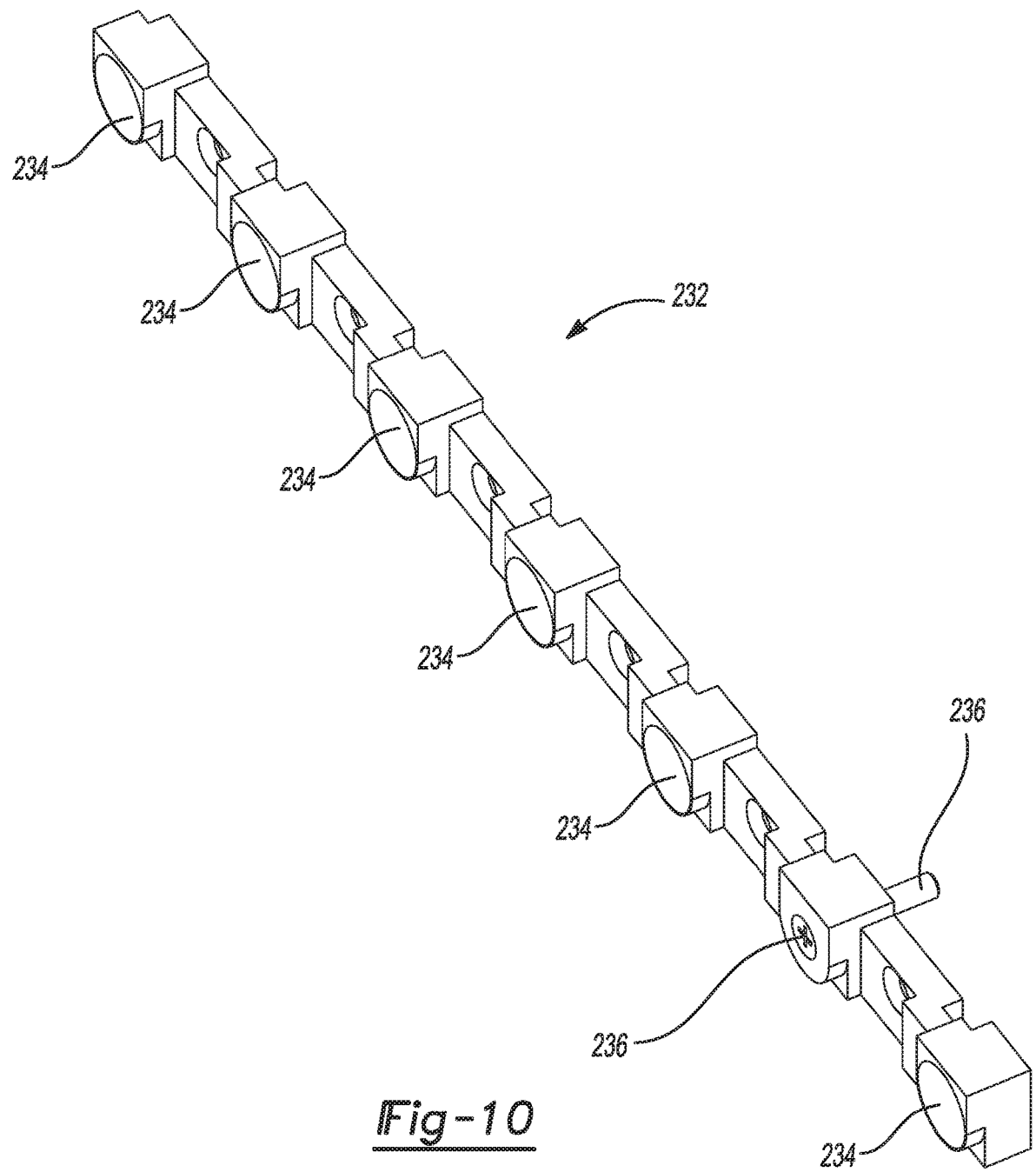
FIG. 10 is a perspective view of a guide block of the rear side of the backplane of FIG. 9.

Referring to FIGS. 9-10, a rear surface 230 of the backplane 26 is shown. One or more guide blocks 232 may be fixed to the rear surface 230 of the backplane 26. The guide block 232 may include a plurality of apertures 234. The centers of the apertures 234 of the guide block 232 may be aligned with the cutout portions 218 of the fastener blocks 210 on the front side 44 of the backplane 26 and centers of the apertures 222 in the backplane. A quantity of apertures 234 may be equal to the quantity of front slots 44. In one example, the electronics assembly 10 includes two guide blocks 232 and each guide block includes seven apertures 234 for a total of fourteen apertures 234. One or more of the apertures 234 may include captive threaded fasteners 236. As will be described in greater detail below, locations adjacent to the captive fasteners 236 in the rear card cage portion 28 may be configured to receive RTM boards 150.

Figure 11:
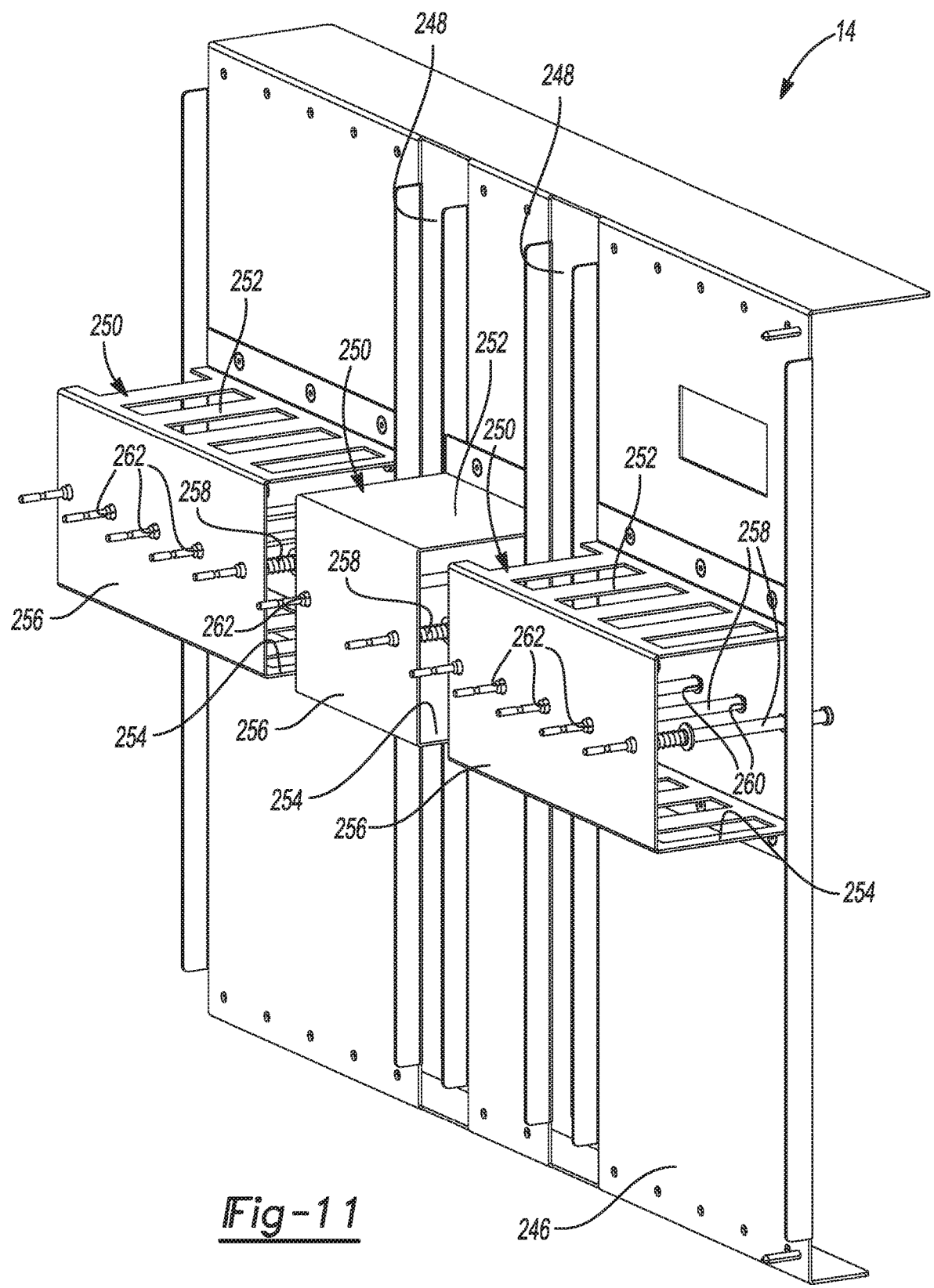
FIG. 11 is a perspective view of an inside of a back plate of the chassis of FIG. 1.
Figure 12:
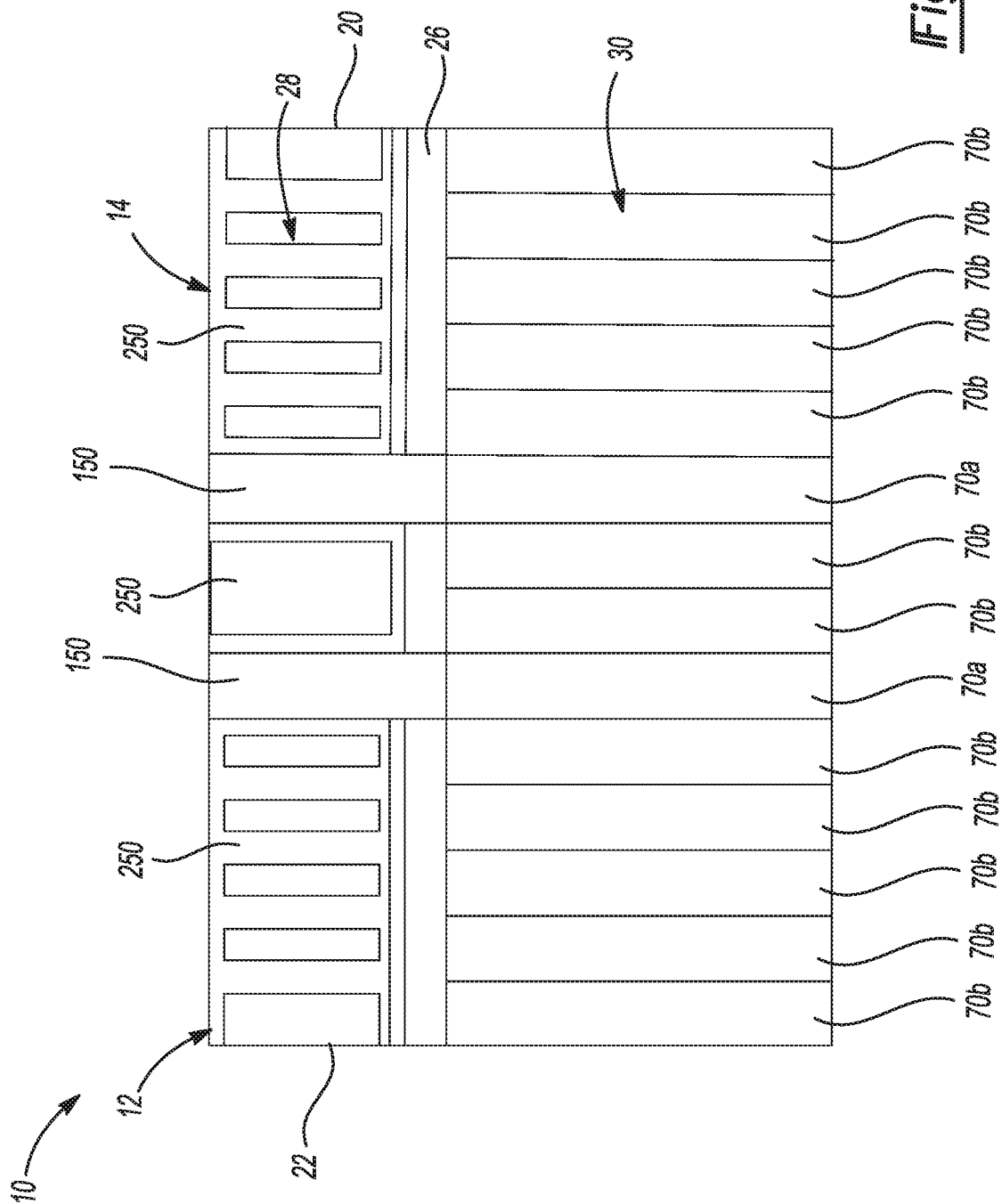
FIG. 12 is a plan view of a top of the electronics assembly of FIG. 1.

With reference to FIG. 11, an inside surface 246 of the back plate 14 is shown. The back plate 14 may define one or more rear slots 248. For example, the back plate 14 may define two rear slots 248 to accommodate two respective RTM boards 150 (FIG. 12). One or more fastener guide brackets 250 may be fixed to the inside surface 246 of the back plate 14. Each fastener guide bracket 250 may include a top wall 252 extending substantially perpendicular to the back plate 14, a bottom wall 254 extending substantially perpendicular to the back plate 14 and substantially parallel to the top wall 252, and an inner wall 256 extending between the top wall 252 and the bottom wall 254 and substantially parallel to the back plate 14.

The back plate 14 may define first plurality of apertures 260 and the inner wall 256 of the fastener guide bracket 250 may define a second plurality of apertures 260. Centers of the first aperture 260 in the back plate 14, the second aperture 262 in the inner wall of the fastener guide bracket 250, the aperture 234 in the guide block 232 of the rear side 230 of the backplane 26, and the aperture 222 in the backplane 26 may be aligned so that a threaded fastener 258 can pass through each of the aligned apertures 260, 262, 234, 222.

Figure 13:
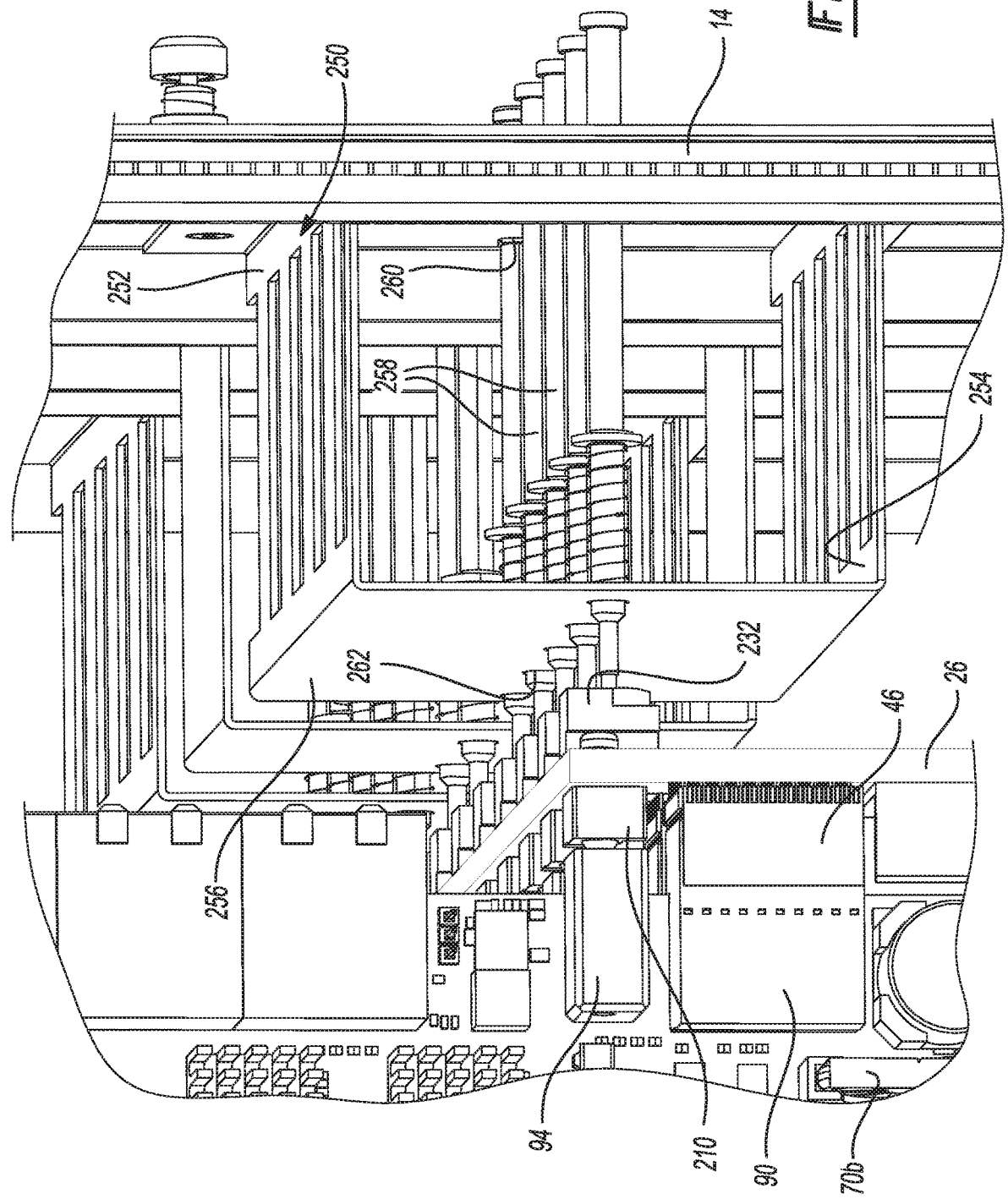
FIG. 13 is a partial right perspective view of the back plate of FIG. 11 engaging the backplane of FIG. 7 and the ATCA blade board of FIG. 2.

With reference to FIGS. 12-13, the ACTA blade boards 70 may include first ATCA blade boards 70a and second ATCA blade boards 70b. Two first ATCA blade boards 70a are aligned with and physically and electrically connected to RTM boards 150 (FIG. 6) in the third zone 36 (FIG. 1) over the backplane 26. Twelve second ATCA blade boards 70b are not aligned with or connected to RTM boards 150. Thus, the back card cage portion 28 is open to house the fastener guide brackets 250 in areas adjacent to the second ATCA blade boards 70b.

The middle fastener blocks 94 of the first ATCA blade boards 70a are fixed to the fastener blocks 210 of the backplane 26 by the fasteners 236 extending through the guide block 232 on the rear side 230 of the backplane 26 (FIG. 9). The captive threaded fasteners 236 do not extend from the backplane 26 to the back plate 14 so that the RTM boards 150 can be installed in the rear slots 248. A tool, such as a screw driver, can be inserted through a passage in the back plate 14 to access the fasteners 236 (not shown).

The middle fastener blocks 94 of the second ATCA blade boards 70b are fixed to the fastener blocks 210 of the backplane by the threaded fasteners 258 extending through the back plate 14 and the fastener guide block 250. As best shown in FIG. 13, the bottom electrical connector 90 of the second ATCA blade board 70b is physically and electrically connected to the electrical connector 46 of the backplane 26. The second surface 128 of the middle fastener block 94 on the second ATCA blade board 70b engages the second surface 216 of the fastener block 210 of the backplane 26. The third surface 134 of the middle fastener block 94 on the second ATCA blade board 70b engages the backplane 26. The guide pin 220 of the fastener block 210 of the backplane 26 engages the guide pin receptacle 138 in the middle fastener block 94 of the ATCA blade board 70 to ensure proper alignment of the electrical connectors 46, 90.

The middle fastener block 94 and the bottom electrical connector 90 may be located adjacent to one another on the inboard end 72 of the ATCA blade board 70. Similarly, the fastener block 210 and the electrical connector 46 may be located adjacent to one another on the backplane 26. In this manner, the electrical connectors 46, 90 are fixed to one another. Fixing the electrical connectors 46, 90 to one another at an area adjacent to the electrical connectors 46, 90 ensures that the electrical connectors 46, 90 remain in physical and electrical contact during high vibration and shock loads. Thus, the locking mechanisms 94, 210 of the present disclosure provide improved contact of the electrical connectors 46, 90 when compared to conventional circuit boards that are fixed to one another indirectly, through the chassis 12.

Although the locking mechanisms 94, 210 are shown and described with respect to the ATCA blade board 70 and the backplane 26, one skilled in the art would appreciate that the locking mechanisms 94, 210 may be used with other circuit boards to fix a connector of a circuit card to a connector of a backplane. It should be appreciated that a location of the guide pin receptacle 138 and the aperture 222 may be reversed within the scope of the present disclosure. Similarly, the location of the guide pin 220 and the guide pin receptacle 138 may be reversed within the scope of the present disclosure.

As discussed throughout, the locking mechanism concept of the present disclosure can be applied to other form factors besides ATCA, such as PCI Express (PCIe), compactPCI (CPCI), and safety critical platforms, by way of non-limiting example. The locking mechanism concept of the present disclosure may also be applied to other circuit cards within the ATCA chassis, such as a power entry module (PEM) and a fan controller module, by way of non-limiting example. The locking mechanism according to the principles of the present disclosure can be used to secure electrical connectors to one another on any PCBs. Use of the locking mechanism may be particularly advantageous where a PCB assembly is subject to high shock and high vibration loads.

Figure 14:
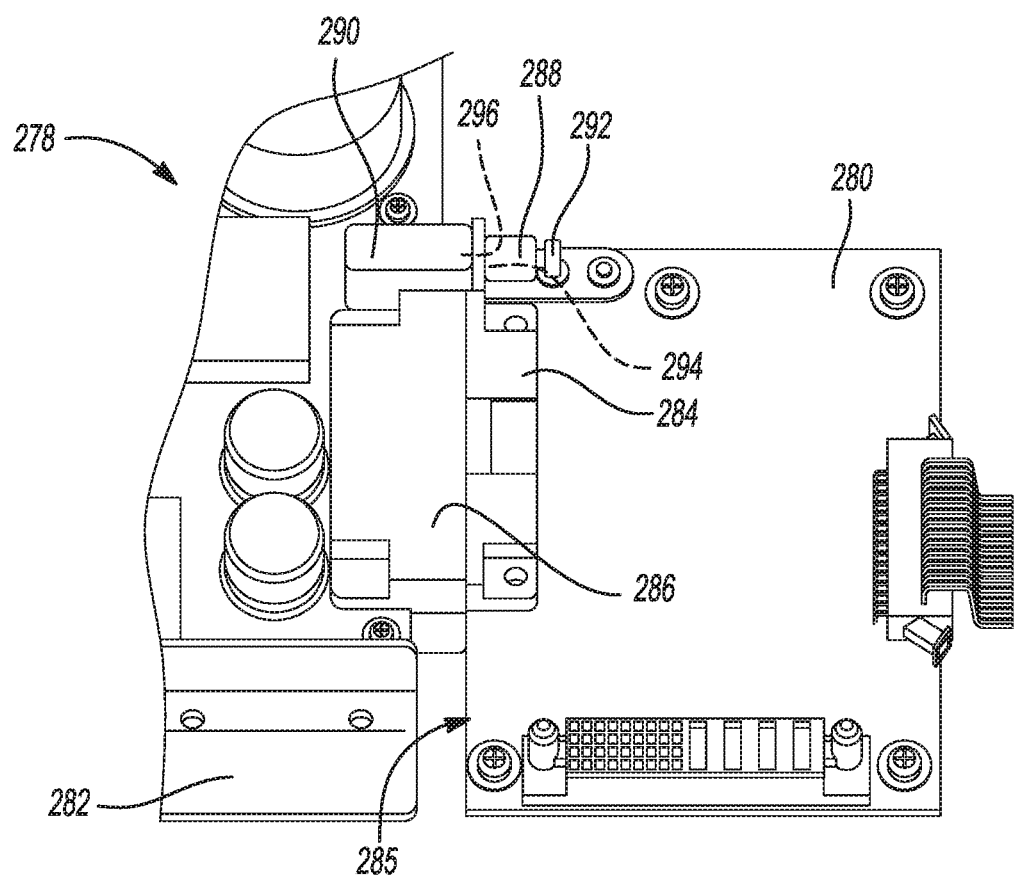
FIG. 14 is a partial perspective view of a fan controller module and a backplane having respective first and second connectors fixed to one another by a threaded fastener in accordance with the present disclosure.

Referring to FIG. 14, a circuit card assembly 278 is provided. The circuit card assembly includes a fan controller module 280 and a backplane 282. The fan controller module 280 includes an electrical connector 284 disposed at an inboard end 285 of the fan controller module 280. The electrical connector 284 is physically and electrically connected to a mating connector 286 of a backplane 282.

The fan controller module 280 further includes a fastener block or locking mechanism 288 disposed adjacent to the connector 284. The backplane 282 includes a fastener block or locking mechanism 290 disposed adjacent to the matting connector 286. The locking mechanism 288 of the fan controller module 280 includes a captive threaded fastener 292 disposed in an aperture 294. The locking mechanism 290 of the backplane includes a threaded receptacle 296. The threaded receptacle 296 receives the threaded fastener 292 to fix the connector 284 of the fan controller module 280 to the mating connector 286 of the backplane 282.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:
1. A circuit board comprising:
a first locking mechanism configured to secure the circuit board to a chassis;

a connector disposed at an inboard end of the circuit board, the connector being configured to be electrically connected to a mating connector on one of a backplane or circuit card; and a second locking mechanism disposed at the inboard end of the circuit board, the second locking mechanism being configured to secure the connector of the circuit board to the mating connector of the one of the backplane or circuit card, wherein the second locking mechanism includes a threaded receptacle for receiving one of a threaded fastener or a captive threaded fastener, the one of the threaded fastener or captive threaded fastener extends through an aperture in a wall of a chassis of an electronics assembly to maintain engagement between the inboard end of the circuit board and the one of the backplane or the circuit card.

2. The circuit board of claim 1, wherein the second locking mechanism is disposed adjacent to the connector.

3. The circuit board of claim 1, further comprising a third locking mechanism disposed at the inboard end of the circuit board, wherein the connector is disposed between the second locking mechanism and the third locking mechanism.

4. The circuit board of claim 1, wherein the one of the backplane or circuit card includes the other of the threaded receptacle or the threaded fastener, and the threaded receptacle is configured to engage the threaded fastener to secure the connector of the circuit board to the mating connector of the one of the backplane or circuit card.

5. The circuit board of claim 1, further including one of a guide pin or a guide pin receptacle, wherein the one of the backplane and circuit card includes an other of the guide pin or the guide pin receptacle, and the guide pin receptacle is configured to receive the guide pin.

6. A circuit card assembly comprising:
a first circuit board including a first connector and defining a first threaded receptacle disposed adjacent to the first connector;
a second circuit board including a second connector and defining a first aperture adjacent to the second connector, the second connector engaging and being electrically connected to the first connector; and
a first threaded fastener extending through the first aperture of the second circuit board and being received in the first threaded receptacle of the first circuit board to maintain engagement between the first connector and the second connector,
wherein the first threaded fastener extends through an aperture in a wall of a chassis of an electronics assembly to maintain engagement between the first circuit board and the second circuit board.

7. The circuit card assembly of claim 6, wherein the first circuit board further includes a first locking mechanism configured to engage a chassis to fix the first circuit board to the chassis and the second circuit board further includes a second locking mechanism engaging the chassis to fix the second circuit board to the chassis.

8. The circuit card assembly of claim 6, wherein the first circuit board further includes one of a guide pin or a guide pin receptacle, the second circuit board includes an other of the guide pin or the guide pin receptacle, and the guide pin is at least partially disposed in the guide pin receptacle.

9. The circuit card assembly of claim 6, further comprising a helical spring disposed around a shaft of the first threaded fastener and engaging a head of the first threaded fastener, the helical spring bring configured to be compressed when the first threaded fastener is fully engaged in the first threaded receptacle.

10. The circuit card assembly of claim 6, wherein:
the first circuit board further defines a second threaded receptacle and the first connecter is disposed between the first threaded receptacle and the second threaded receptacle;
the second circuit board further defines a second aperture and the second connector is disposed between the first aperture and the second aperture; and
the second circuit board further comprises a second threaded fastener extending through the second aperture of the second circuit board and being received in the second threaded receptacle of the first circuit board.

11. The circuit card assembly of claim 6, wherein the first circuit board and the second circuit board are independently selected from one of a backplane, an advanced telecom computing architecture (ATCA) circuit board, a PCI Express (PCIe) circuit board, a compactPCI (CPCI) circuit board, and a safety critical platform.

12. The circuit card assembly of claim 6, wherein at least one of the first circuit board and the second circuit board is an ATCA circuit board.

13. An electronics assembly comprising:
a chassis comprising a first wall, the first wall defining a first aperture;
a first circuit board disposed within the chassis, the first circuit board including a first connector and defining a threaded receptacle disposed adjacent to the first connector;
a second circuit board disposed within the chassis, the second circuit board comprising a second connector and defining a second aperture, the second connector engaging and being electrically connected to the first connector; and
a threaded fastener extending through the first aperture and the second aperture, and being received in the threaded receptacle of the first circuit board to maintain engagement between the first connector and the second connector, wherein the first circuit board and the second circuit board are differently selected from one of a first circuit card, a second circuit card, or a backplane.

14. The electronics assembly of claim 13, wherein the first circuit board further includes a first locking mechanism engaging the chassis to fix the first circuit board to the chassis and the second circuit board further includes a second locking mechanism engaging the chassis to fix the second circuit board to the chassis.

15. The electronics assembly of claim 13, wherein the first circuit board further includes one of a guide pin or a guide pin receptacle, and the second circuit board includes an other of the guide pin or the guide pin receptacle, and the guide pin is at least partially disposed within the guide pin receptacle.

16. The electronics assembly of claim 13, further comprising a helical spring disposed around a shaft of the threaded fastener and engaging a head of the threaded fastener, the helical spring bring configured to be compressed when the threaded fastener is fully engaged in the threaded receptacle.

17. The electronics assembly of claim 13, further comprising a guide bracket fixed to the chassis, the guide bracket being disposed substantially parallel to and between the second circuit board and the first wall, and the guide bracket defining a third aperture, wherein the threaded fastener extends through the first aperture, the third aperture, and the second aperture.

18. The electronics assembly of claim 13, wherein the first circuit board and the second circuit board are independently selected from one of the backplane, an advanced telecom computing architecture (ATCA) circuit board, a PCI Express (PCIe) circuit board, a CompactPCI (CPCI) circuit board, and a safety critical platform.

19. The electronics assembly of claim 13, wherein at least one of the first circuit board and the second circuit board is an advanced telecom computing architecture (ATCA) circuit board.

20. The electronics assembly of claim 19, wherein the first circuit board is the ATCA circuit board and the second circuit board is the backplane.

\* \* \* \* \*